United States Patent [19]

Lewis

[11] 4,010,453

[45] Mar. 1, 1977

[54] STORED CHARGE DIFFERENTIAL SENSE AMPLIFIER

[75] Inventor: Scott Clarence Lewis, Essex Junction, Vt.

[73] Assignee: International Business Machines Corporation, Armonk, N.Y.

[22] Filed: Dec. 3, 1975

[21] Appl. No.: 637,440

[52] U.S. Cl. .................... 340/173 R; 340/173 FF; 307/238; 307/279

[51] Int. Cl.$^2$ ...................................... G11C 11/40

[58] Field of Search ................ 340/173 R, 173 FF; 307/238, 279

[56] References Cited

UNITED STATES PATENTS 3,946,368  3/1976  Chou ........................... 340/173 R

*Primary Examiner*—Terrell W. Fears
*Attorney, Agent, or Firm*—Howard J. Walter, Jr.

[57] ABSTRACT

A differential sense amplifier for semiconductor memory cells is described which uses charge transfer preamplification in combination with a ratioless cross-coupled latch circuit to provide sensing and regeneration of binary information stored in a charge storage device. The sense amplifier may be utilized in arrays of single FET/capacitor memory cells in which the sense amplifier is centrally located and data input/output connections are made at one outside edge of the array. Single bit line driving is made possible by the use of a bit decoder which unconditionally couples charge to a single bit line common mode charge coupling to decrease potentials on a pair of bit lines coupled to the sense amplifier. The common mode bit line discharge means also increases response of the charge transfer preamplifier stage. A single transmission gate device is used for both reading out from a single bit line and writing new data into a memory cell, thus simplifying the input/output circuitry. A sense node shunting device is utilized during the bit line precharge portion of the memory cycle to partially charge the bit sense line previously discharged to ground in order to conserve power and to ensure proper operation of the charge transfer preamplifier on the next memory cycle. In semiconductor memory applications where high performance is critical, the charge transfer preamplifier stage and common mode discharging circuit may be omitted and the bit lines connected directly to the sense nodes of a cross-coupled latching circuit without the loss of other benefits of the circuit.

20 Claims, 5 Drawing Figures

STORED CHARGE DIFFERENTIAL SENSE AMPLIFIER

BACKGROUND OF THE INVENTION:

1. Field of the Invention:

This invention relates to semiconductor memory systems and particularly to information sense amplifiers for differentially sensing information signals provided by stored charge memory cells.

2. The Prior Art:

The single FET/capacitor storage cell, see U.S. Pat. No. 3,387,286, "Field Effect Transistor Memory," R. H. Dennard, assigned to the assignee of the instant invention, is attractive for semiconductor memories because of its small area and relatively simple structural requirements. However, one of the major design difficulties in implementing such memory systems lies in the difficulty in detecting information signals. Because of the severe attenuation of the stored signal during a read operation, when the stored charge is redistributed between the cell storage capacitance and the comparatively large bit/sense line capacitance, difficult design barriers are faced in order to improve the density of the storage circuits in order to reduce production costs. As a result, unless very sensitive sense amplifiers are used, storage capacitances must be large, thus increasing the cell area. An alternative solution is to limit the number of bits per bit/sense line and/or sense amplifier. This not only requires more sense amplifiers but makes the topological design of a high density memory chip rather difficult. One design approach previously utilized to improve the ratio of storage capacitance to bit line capacitance has been the use of a split memory array in which a centrally located differential sense amplifier including a cross-coupled regenerative FET latch circuit. Although different specific circuit designs have been previously proposed for such amplifiers, they may be generally divided into two types, both of which may be embodied in static or dynamic logic configurations. In the first type, the memory bit lines are initially precharged to a relatively high potential. A charged or uncharged memory capacitor is coupled to one bit line and a reference potential, provided by a dummy storage cell, is coupled to the other bit line creating a differential input signal. The cross-coupled regenerative latch is then energized such that a race discharge condition is initiated. The cross-coupled FET having its gate connected to the bit line with the higher potential will become conductive as its source is pulled down and will discharge the lower potential bit line. The bit line with the higher potential will maintain its original potential. An example of this type of sense amplifier is described in U.S. Pat. No. 3,678,473, entitled, "Read-Write Circuit for Capacitive Memory Arrays," to S. E. Wahlstrom. The second type of sense amplifier initially precharges the bit lines to ground potential and after introducing a differential signal, by coupling a storage capacitor to one of the bit lines, activates the sense amplifier by charging the bit lines up until one of the cross-coupled FET's reaches a threshold potential in which case the sense amplifier latch is then set. An example, of this type is described in U.S. Pat. No. 3,838,404, entitled "Random Access Memory System and Cell," to R. H. Heeren. A variant of the second type, in which the bit lines are partially charged to an intermediate voltage in order to reduce the time necessary to reach a threshold voltage is also described in the last referred to patent. Although such sense amplifiers are widely utilized in industry they are still subject to the limitation provided by the ratio of storage capacitance to bit line capacitance. In addition, any device imbalances, such as differences in threshold voltage, will cause further insensitivity of the sense amplifier.

Additional improvements in FET sense amplifier design are taught in U.S. Pat. No. 3,764,906, entitled "Stored Charge Detection by Charge Transfer," issued Oct. 9, 1973, to L. G. Heller and assigned to the instant assignee, which teaches a charge transfer, or bucket brigade, sensing technique which is independent of device parameters and can effectively transfer potentials on the storage capacitor directly to the sense node, irrespective of the bit line capacitance. This technique although more sensitive to input voltages, is slower than the dynamic latch due to the time required to fully charge the large bit/sense line capacitance through an FET approaching cut off while operating in its saturation region. Improvements in charge transfer sense amplifiers are found in U.S. Pat. No. 3,760,381, entitled "Stored Charge Memory Detection Circuit," issued Sept. 18, 1973, to Y. L . Yao, and assigned to the instant assignee, and in the article, "Differential Sense Amplifier," by D. P. Spampinato, IBM Technical Disclosure Bulletin, November 1974, pages 1797–8. These last two references utilize the charge transfer circuit as a preamplifier for a differential sense latch.

Another problem confronted by circuit designer of single FET/capacitor memory arrays is that of providing necessary support circuitry on the semiconductor chip for writing information into the memory array as well as sensing data stored in the array. When using the sense amplifiers described above, in which the bit lines are initially precharged to a high potential, and in the case of charge transfer sense amplifiers, a particular support circuitry design problem becomes apparent. In order to achieve optimum performance in the memory, design criteria dictates that the precharge potential as well as the stored data charge potential be as close as possible to the maximum available supply potential provided to the semiconductor chip. When such a criteria is dictated by other considerations, it then becomes necessary to directly drive both bit lines coupled to the sense amplifier in order to properly write data into both halves of the memory array. This problem has been solved in the past by designing memory arrays in which the bit line decoders and the sense amplifiers are both placed in the central portion of the memory array. Unfortunately, this approach makes it difficult to provide paths for data between the bit decoders and the data input/output pads, normally located at the edge of the semiconductor chip. Another approach is to provide two sets of bit decoders, one for each bit line, at the expense of silicon area. Both solutions are hardly efficient when the overall objective is to obtain maximum memory array density on the chip. Although it is possible to write data by driving only a single bit line when using a sense amplifier which utilizes bit line precharging potentials which are lower than the highest available supply potential, such a result is achieved only through a loss of performance and increases in the complexity of timing signals required to operate the memory.

SUMMARY OF THE INVENTION:

It is therefore an object of this invention to provide a sense amplifier for stored charge memory arrays in which maximum precharge potentials may be used and which may be driven from a single bit line through a single bit decoder located along an outside edge of the memory array.

It is another object of this invention to provide an improved sense amplifier of the type which utilizes a charge transfer preamplifying stage in combination with a cross-coupled differential latching circuit.

The circuit of this invention provides improvement in cross-coupled differential semiconductor sensing circuits by providing a bit decode circuit capable of selectively coupling, during a write cycle, a charge to a previously precharged bit line followed by the coupling an equal charge quantity from a pair of associated bit lines in order to properly condition a cross-coupled differential sense amplifier to write data in either side of a split memory array. The described decoder and writing technique may be utilized with conventional cross-coupled differential sense amplifier circuits as well as with those utilizing charge transfer preamplifying circuits.

The foregoing and other objects, features and advantages of the invention will be apparent from the following more particular description of a preferred embodiment of the invention, as illustrated in the accompanying drawings.

DESCRIPTION OF THE PREFERRED EMBODIMENT:

Although N-channel enhancement type FET devices are utilized in the following examples and embodiments, it will be appreciated by those skilled in the art that P-channel enhancement devices, as well as other types of semiconductor devices may also be utilized to achieve the same results. Before the describing the preferred embodiment of the invention, FIGS. 1 and 2 will be briefly referred to in order to assist in the understanding of the invention.

Figure 1:
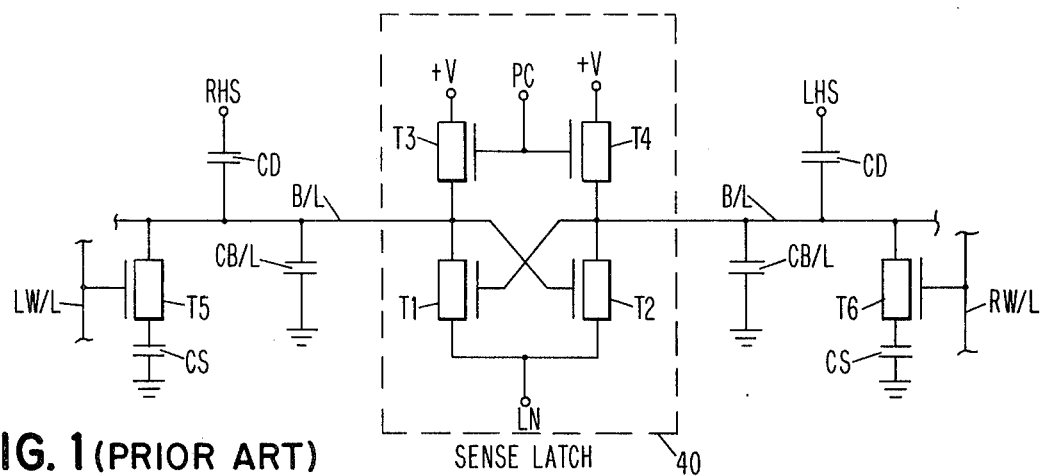
FIG. 1 is a schematic circuit diagram of a crosscoupled semiconductor sense amplifier latch of the type described in the prior art.

Referring to FIG. 1, there is shown a schematic circuit diagram of a portion of an integrated circuit memory system which includes a prior art cross-coupled differential sense amplifier utilized in a split array of single FET/capacitor charge storage memory cells. Although only a single addressable memory cell in each array half is shown, it will be understood by those skilled in the art, that in an actual system, there are normally provided a plurality of memory cells organized in rows and columns in each array half. In the example shown, columns of memory cells are associated with word accessing lines and rows of memory cells are associated with pairs of bit accessing lines, each row having a single sense amplifier, or sense latch circuit. Each memory array half includes a pluraliy of charge storage cells comprising a gating FET T5 or T6 for selectively coupling a storage capacitance Cs to a bit/sense line B/L in response to an address signal provided on one of word lines RW/L or LW/L driven by a word decoder, not shown. It will be understood that each word line is associated with a plurality of bit lines each of which are coupled to a different sense latch. Each bit/sense line B/L also has coupled to it an additional number of memory cells, not shown, which are associated with different addressable word lines. Bit/sense line B/L has associated with it an inherent, or parasitic, capacitance CB/L which is rather large when compared with the storage capacitance CS. Each bit/sense line also has associated with it one reference level providing means, here shown as a reference capacitor CD, normally referred to as a dummy cell, as known in the art. Each capacitance CD is coupled to a write half select RHS or left half select LHS signal line. These signal lines are responsive to the address input to the word lines of the array and when a charge storage cell on the left of half array is selected the LHS line is active, when a charge storage cell on the right half of the array is selected the RHS line is active. Coupled to each pair of bit lines B/L is a cross-coupled sense latch 40 which includes cross-coupled FET's T1 and T2 having drain electrodes coupled to precharge devices T3 and T4, respectively, and having their source electrodes coupled to the common latch node LN. The gates of the precharge devices T3 and T4 are coupled to a precharge signal PC. The drains of the precharge devices are coupled to a positive supply potential V which is the highest available supply potential on the semiconductor chip. Sense latch 40 is used during both writing and sensing of information to establish proper potentials on the bit lines for operation of the memory array. Prior to the memory access cycle, the precharge line PC is brought to a high level turning on precharge devices T3 and T4 allowing the bit lines B/L to charge up to a potential equal to LV, V minus one threshold, or, if the precharge signal PC is bootstrapped, the precharge potential may be V volts. During this time the word lines are at the low level so that charge storage gating devices T5 and T6 are nonconductive. The latch node LN is at a high level so that the latch is disabled and the right and left half select lines RHS and LHS are at a high level. After the bit lines B/L have been charged, precharge signal PC goes low turning off devices T3 and T4 isolating the bit line potentials. Assuming that it is desired to sense the charge state of storge capacitor CS associated with charge storage gate T6, a word decoder, not shown raises the potential on the right word line RW/L gating the storage capacitance CS onto its associated bit line. At the same time as the right word line is activated, the right half select RHS signal is lowered causing a reference signal equal to one-half that between a 0 and a 1 storage charge to be placed on the left bit line. If the storage capacitor CS was fully charged, no displacement of potential on the right bit line will occur and when the latch node falls to ground cross-coupled device T1 will turn on prior to T2 allowing the left bit line to be discharged to ground and sustaining the right bit line at its precharged potential. The voltage output from the sense latch is then sensed by additional circuitry prior to being gated off of the chip. While it can easily be seen thaat either bit line may be individually sensed to determine the existing state of a storage cell, the conditions under which data may be written into the cell are quite different. Assume now that a high level charge is currently stored in storage capacitor CS associated with the left word line gating device T5 and it is desired to write a low level, or no charge state, in the storage capacitor. Assume also that only the right bit line is accessible to a bit drive means. It will be noted that, after precharging, both bit lines will be at the high potential V or LV and that when the left word line is accessed the left hand select line LHS will also couple a charge out of the right bit line and thus lower the potential on the right-hand side of the latch. Although it is a simple matter to discharge the right bit line through an external device therefore leaving the high potential on the left bit line, it is not so easy a matter to sustain a high potential on the right bit line in order to cause the sense latch to set with the left bit line grounded. This problem has been met by the prior art by merely driving both bit lines directly such that the desired bit line will always be discharged in order to write both high and low level states into memory cells on both halves of the array. In addition, the sense amplifier of FIG. 1 also suffers from the voltage sensitivity problem caused by the ratio of storage capacitance to bit line capacitance as well as any irregularities or differences between the thresholds of cross-coupled devices T1 and T2.

Figure 2:
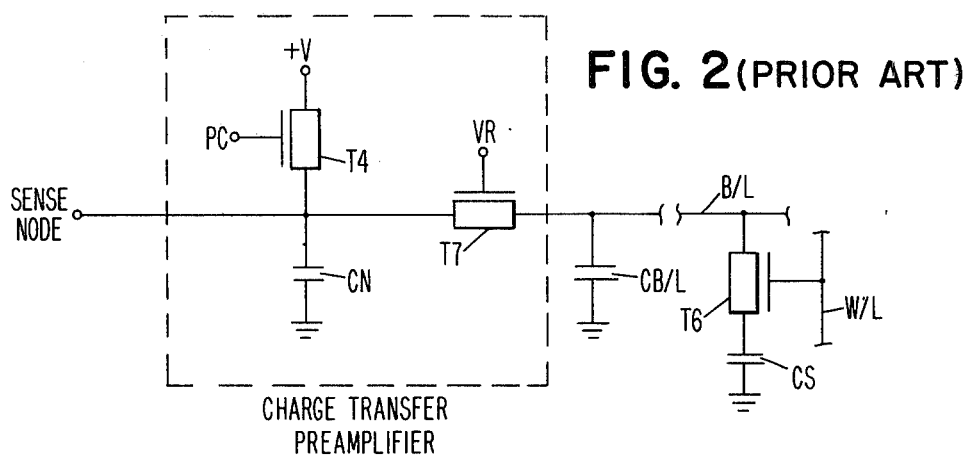
FIG. 2 is a schematic circuit diagram of a single ended charge transfer preamplifier for sensing data in a charge storage memory array, as taught by the prior art.

Referring now to FIG. 2, there is shown a schematic circuit diagram of a charge transfer preamplifier circuit as described more fully in U.S. Pat. No. 3,764,906, referred to previously. Devices and circuit elements similar in function to those in FIG. 1 are identified with the same reference numbers and symbols as those utilized in FIG. 1. A single FET/capacitor storage cell comprises a word line gated FET of T6 coupled to storage capacitance CS. The drain of the gating device T6 is connected to the bit line B/L having parasitic capacitance CB/L. Instead of connecting the bit line directly to the sense node as described with respect to FIG. 1, the bit line is coupled to the source electrode of a charge transfer device T7 which has its gate electrode connected to a source of reference potential VR and its drain electrode connected to a sense node. Bit line precharging is achieved through a precharge device T4 having its gate coupled to a precharge signal PC and its drain coupled to the highest available supply potential V. In operation, the charge transfer preamplifier operates as follows. Prior to initiating a sense operation, precharge signal PC goes high causing the sense node and its associated capacitance CN to be charged to the potential of the supply V or to LV. Reference potential VR is selected such that it is equal to or less than the potential to which the sense node is precharged. The bias conditions on charge transfer device T7 are such that it becomes conductive and begins charging the parasitic bit line capacitance CB/L. As the bit line potential approaches LVR, the current through T7 approaches zero. At this point precharge signal PC is switched to its low state turning off T4. When the word line turns on device T6, little or no current flows from the bit line if a positive charge has been previously stored on storage capacitance CS. However, if the storage node is at O potential, enough charge flows from the bit line to equalize the potentials on capacitors CB/L and CS. This small change the bit line potential is normally the signal available for sensing in a conventional sense latch as is described with respect to FIG. 1. Because of the pre-conditioning potentials previously applied to charge transfer device T7 however, T7 will again turn on returning charge to the bit line raising its potential again to LVR at which point T7 again becomes nonconductive. If the ratio of the sense node capacitance CN to bit line capacitance CB/L is small, the potential change on the sense node because of the charge transfer operation will be significant. For example, if the ratio of the capacitance is 1/10 the change in voltage at the sense node will be ten times greater than that seen by the bit line. The charge transfer sensing technique effectively eliminates the signal attenuation normally caused by the presence of bit line capacitance in a conventional directly driven latch type sense amplifier. As in previously described U.S. Pat. No. 3,760,381, a charge transfer preamplifier circuit may be utilized in a split array storage matrix having a centrally located differential sense latch coupled to the sense nodes. However, it should be noted that since the charge transfer preamplifier is initially precharged from the sense nodes, charge transfer device T7 appears effectively as a reverse biased diode to the bit lines. The application of potentials in excess of LVR applied to the bit line will have no influence on the sense node and in a split array configuration it becomes necessary to provide direct access to both left and right bit lines in order to write 1's and 0's in all of the memory cells.

Figure 3:
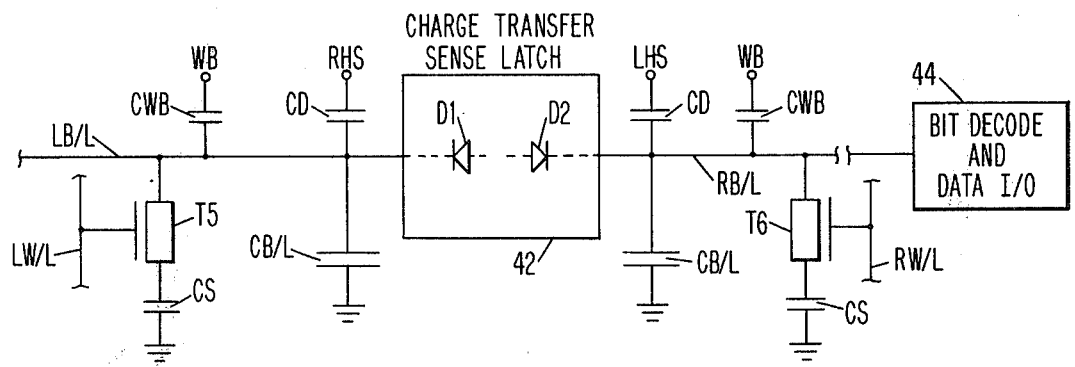
FIG. 3 is a partial schematic circuit diagram of a charge storage memory array including a charge transfer sense latch and is used to illustrate the principles utilized in the writing of data by the instant invention.

Referring now to FIG. 3, there is shown a partial schematic circuit diagram of a memory system in accordance with the subject invention which illustrates the application of the common mode write bias charge removal circuit associated with the bit lines. For purposes of illustration, only one storage capacitance CS is shown associated with each memory array half. Storage node gating devices T5 and T6, responsive to addressing signals on the left word line LW/L and the right word line RW/L, are respectively connected to left and right bit lines LB/L and RB/L. The bit lines are connected to the inputs of the differential sense amplifier 42 depicted as having diodes D1 and D2 at the input nodes. This representation of the sense amplifier 42 is consistent with the above descriptions of the input of the charge transfer preamplifier circuit. Also shown coupled to the bit lines is their parasitic capacitance CB/L and the right half and left half select responsive dummy capacitances CD. Located at the extreme outer end of the right bit line there is provided a bit decode and data input/output (I/O) circuit 44. As described above, when utilizing such sense amplifiers which effectively have diode inputs, if it is desired to write a low charge condition on the storage cells associated with gating device T4 it is necessary to provide a high level input signal on the right bit line RB/L while simultaneously providing a lower level input signal on the left bit line LB/L. Under normal operating conditions in a conventional memory array design, it will be recalled that when a cell is selected on left side of the array a dummy cell on the right side of the array is utilized to withdraw a charge sufficient to provide a signal on the right bit line equal to one-half the potential provided by a fully discharged memory capacitance. Under the assumed conditions in which a fully charged storage capacitor is accessed on the left half array, it will be seen that the precharged potential on the left bit line LB/L will not be disturbed when the left word line LW/L is activated. However, on the right hand bit line the charge Q/2 will be removed when the left hand select signal LHS becomes activated. In order to provide the proper differential offset on the bit lines for such a condition, there is provided a write bias circuit comprising a write bias capacitance CWB and a write bias signal WB which is energized each memory cycle to couple a common charge out of each bit line at the time the word lines are activated. Just prior to the common mode discharging of the bit lines during a write cycle, under the conditions assumed, a positive compensating charge larger than the sum of possible negative transitions on the right bit line is introduced by the bit decode and data I/O circuit 44, as will be explained in more detail below. The effect of the introduced positive charge offsets any negative transitions of the right bit line while the write bias circuit associated with the left bit line has discharged that bit line sufficiently so that the latch may be set in the state in which the left bit line is grounded and the right bit line is sustained at its precharged potential.

Figure 4:
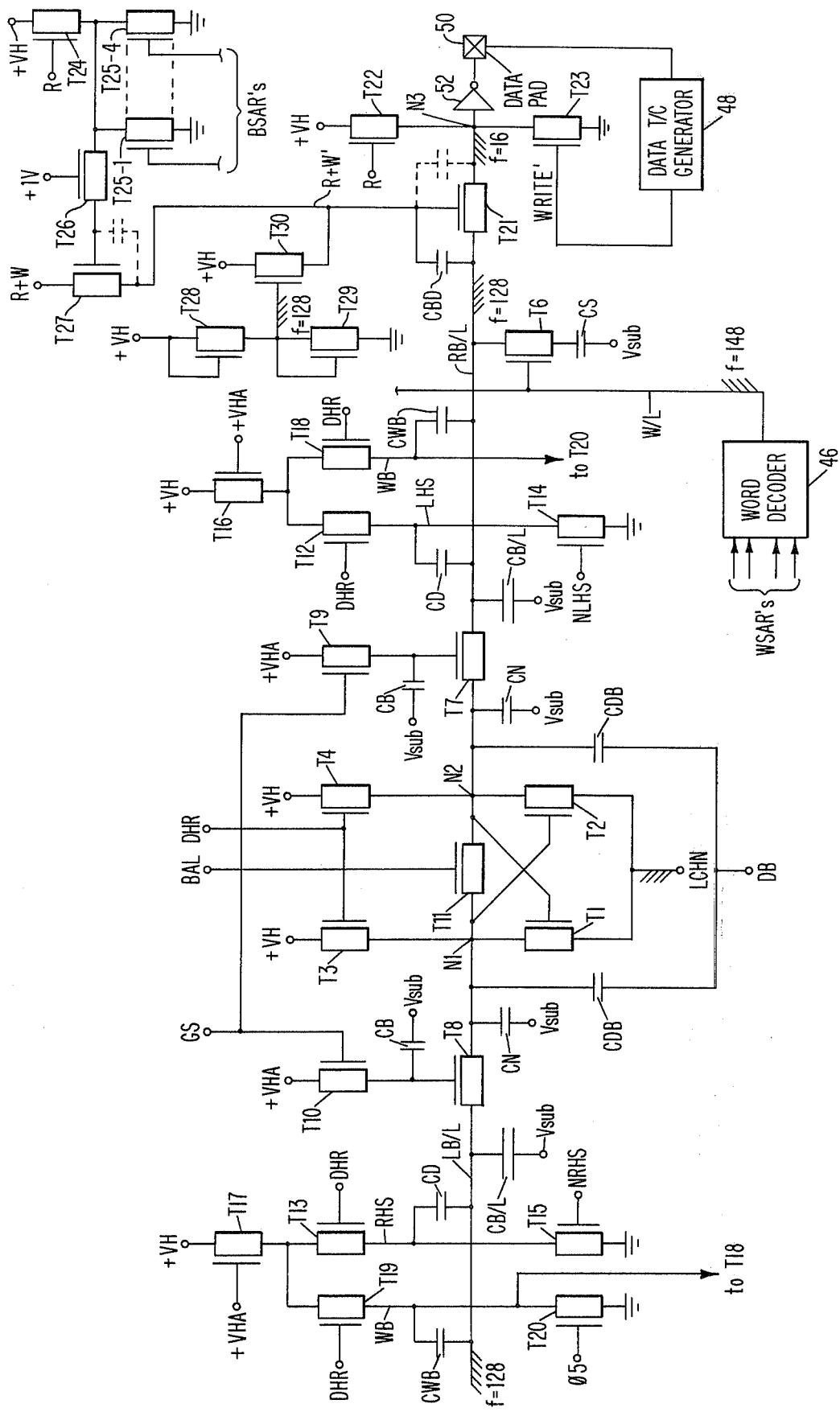
FIG. 4 is a schematic circuit diagram of a preferred embodiment of the subject invention which illustrates the use of the decoding and write biasing circuits of the invention.

Referring now to FIG. 4, there is shown a schematic circuit diagram of a preferred embodiment of the subject invention. Although only one storage capacitance CS and its associated gating transistor T6 is shown, it will be understood by those skilled in the art and from the above descriptions that many memory cells are associated with each of the bit sense lines. The sensing circuit includes cross-coupled FET's T1 and T2 having their source electrodes connected to a latch pull down node LCHN. The drains of T1 and T2 are connected to sense nodes N1 and N2, respectively. Precharging FET's T3 and T4, responsive to the drain high restore pulse DHR, are provided to precharge sense nodes N1 and N2 to the highest available supply potential VH prior to a sense cycle. Charge transfer FET's T7 and T8 couple sense nodes N2 and N1 to the right bit line RB/L and left bit line LB/L, respectively.

In order to insure that the reference potential applied to the gates of the charge transfer devices T7 and T8 are sustained at a DC level in the presence of variances in externally supplied power supply levels, gating devices T9 and T10 are utilized in combination with biasing capacitors CB coupled between the gates of the charge transfer devices and substrate potential Vsub. The gates of T9 and T10 are connected to a gate set signal GS which periodically couples an adjusted high potential supply VHA to the bias capacitors CB during non-sensing portions of the memory cycle. Between sense nodes N1 and N2 there is provided a balancing device T11 which is actuated by the balance signal BAL during the initial precharging portion of the memory cycle. Also coupled to sense nodes N1 and N2 are a pair of common mode drain boost capacitors CDB responsive to a drain boost signal DB. The purpose of the drain boost signal is to provide a common mode positive displacement of the sense nodes after the data signal to be sensed has been applied to the bit lines in order to insure that the charge transfer devices T7 and T8 remain in saturation and to allow the latch to set to a greater extent before the on device becomes electrically couples to the capacitances of the bit line. Also associated with each of the bit lines is a dummy cell structure comprising dummy capacitance CD which is coupled to drain high restore DHR responsive charging devices T12 and T13 and selectively actuated pull down devices T14 and T15 responsive to the decoded right and left select signals NRHS and NLHS. The dummy capacitances CD are charged to a potential of LVHA as provided by devices T16 and T17 having their gates coupled to the adjusted supply potential VHA and their drains coupled to the highest supply potential VH. Also coupled to each of the bit lines are write bias capacitances CWB which are charged to LVHA by the drain high restore pulse DHR through devices T18 and T19. The write bias capacitances are simultaneously discharged through common discharging device T20 in response to a phase 5 timing signal. The word line W/L is connected to the gate of gating device T6 and is driven by a word decoder 46 in response to externally provided word address signals WSAR. At the right end of right bit line RB/L there is provided a common input/output transmission gate T21 having one of its conductive electrodes connected to the bit line and having the other of its conductive electrodes connected to an input/output node N3. The gate of transmission gate 21 is responsive to a decoded read/write signal R+W'. The gate is also coupled to the right bit line RB/L by bit driver coupling capacitance CBD. In the memory system described, 1 of 16 decoders provides a gating read/write signal R+W' to 1 of 16 transmission gate transistors T21, all of which are commonly coupled to a data I/O node N3. During a write cycle node N3 is precharged by restore device T22 in response to restore pulse R. In the event that data corresponding to a high input level to data pad 50 is to be written, node N3 is selectively discharged by device T23 which is responsive to a decoded write pulse WRITE'. The write pulse is provided by a data true/complement (T/C) generator 48 which has its input coupled to data pad 50. Data pad 50 provides external communication for both input and output data to the integrated circuit chip. During a sensing or read cycle, node N3 is conditioned by the potential on the right bit line RB/L and this signal is passed through a clock driven inverter circuit 52 directly to data pad 50. The bit decoder is fairly conventional and comprises a logical NOR circuit including precharging device T24 and pull down devices T25-1 through I25-4. The output of the NOR circuit is coupled through an isolation device T26 to a read/write pulse gating device T27. In order to prevent the decoded read/write line R+W' from being discharged below ground in an unselected decoder under certain conditions, there is also provided a biasing circuit comprising devices T28, T29 and T30. T28 and T29 provide a voltage divider circuit such that the potential applied to the gate of T30 is approximately equal to one threshold drop above ground. The drain of T30 is coupled to voltage supply potential VH which provides a source of potential to charge up unselected decoded read/write lines in the event their potential drops to less than a threshold below the gate potential on T30.

Figure 5:
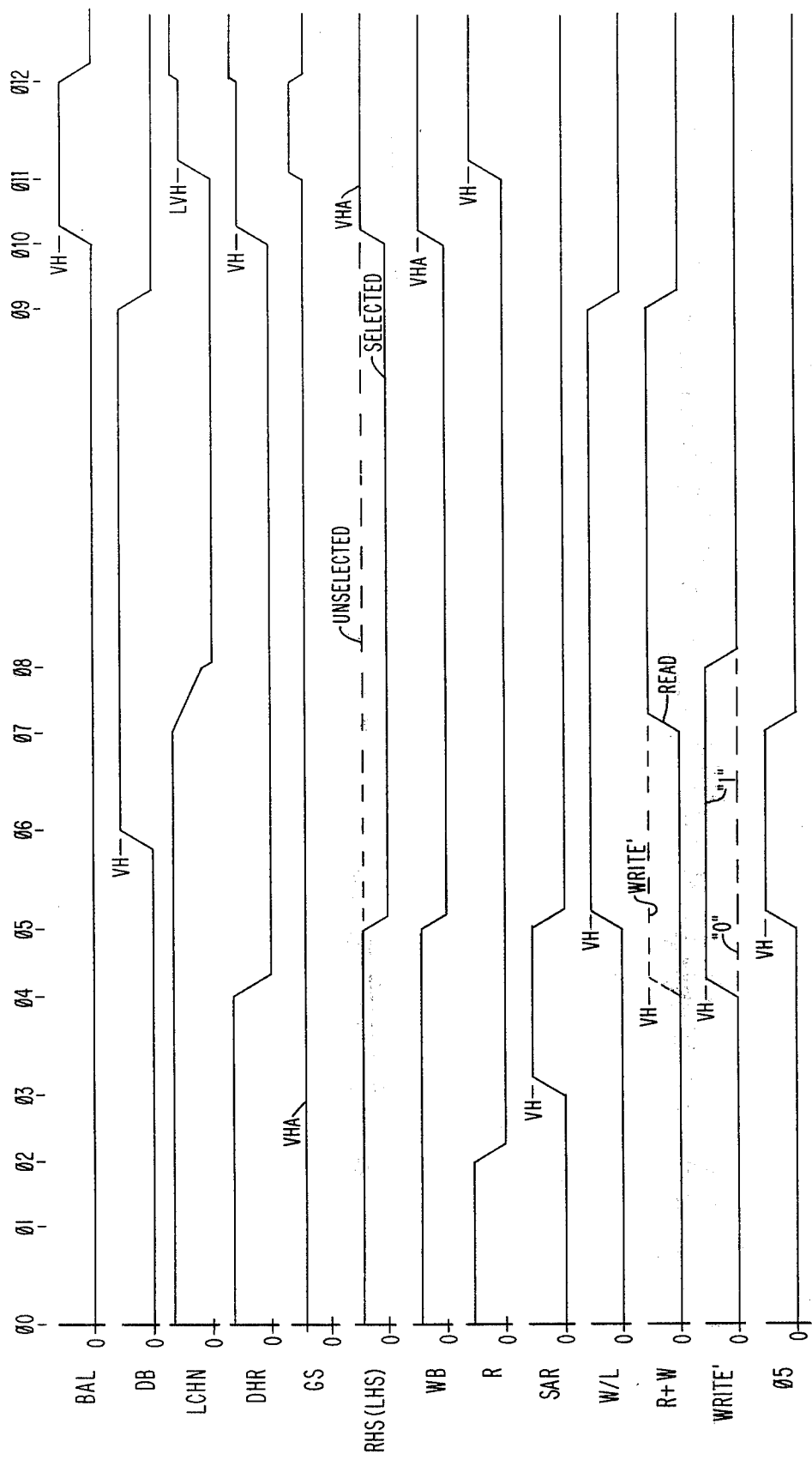
FIG. 5 is a timing diagram illustrating a typical pulse program for operating the memory sense amplifier of FIG. 3.

Referring now to FIGs. 4 and 5, the operation of the sense amplifier will be described. FIG. 5 shows a typical pulse program for operating the circuit of FIG. 4. During a memory cycle operation there are two basic functions which must be performed by the sense amplifying circuit. The first of these functions is to precharge the bit lines to prepare the sense amplifier for sensing a signal provided on the bit lines either as an output signal or as a write signal. The second function is that of actually sensing and rewriting data signals. In each case during the sensing portion the circuit regeneratively amplifiers a small potential difference between the two bit lines reducing the initially lower potential bit line to zero while leaving the other bit line at its precharge potential LVHA.

The bit line restoration process begins at phase 10 of a preceding memory cycle with the balance signal line BAL switching to VH and turning on transistor T11. At this time, drain boost node DB, latch node LCHN, drain high restore node DHR, one of the right or left select nodes RHS or LHS, and write bias node WB are all at ground potential. The gate set node GS is at VH at this time. Since it is assumed that the latch has been previously set to a particular state on a preceding cycle, one of the bit lines is at LVHA and the other is at ground potential. The gates of T7 and T8 are maintained at VHA potential by charges on the capacitors CB, so that T7 and T8 are conditioned for conduction. At the start of phase 10, T11 becomes conductive and connects the two bit lines to each other. This condition utilizes the power in a charged bit line to partially charge the discharged bit line in order to conserve power. The primary purpose, however, of device T11 is to discharge the previously charged bit line from its high potential to such an extent that during the initial precharging the bit line previously having the higher potential will be guaranteed to be recharged exactly up to within one threshold of VHA when the bit lines are again precharged. This feature is important in the charge transfer amplification aspects of the preamplifying stages, particularly in the event that the VHA supply source has been lowered by a variation in power supplied to the memory chip since the last memory cycle. Just after the start of phase 10 the node DHR rises to VH turning on T3, T4, T12, T13, T18 and T19. Both bit lines start charging towards LVHA through devices T3, T4, T7 and T8. Latch node LCHN is floating at this time and begins also to charge towards LVH. At the same time, nodes LHS and RHS, one of which was at ground from the last select cycle, also begin to charge towards LVHA. At phase 11 time, gate set potential GS is driven sufficiently higher than VHA to insure that the bias on capacitor CB has been charged to VHA. At phase 12 time, the drain high restore DHR and the latch node LCHN are driven sufficiently more positive than Vh such that T3 and T4 remain conductive with both drain and source at VH potential. Thus nodes N1 and N2 charge to VH. The left bit line LB/L charges to VHA minus the threshold voltage of T8 and the right bit line RB/L charges to VHA minus the threshold of T7. In a specific circuit embodiment, thresholds of T7 and T8 may differ such that the actual bit line potentials may, in fact, be different. It is also noted that T11 stops conducting as soon as the nodes N1 and N2 rise above LVHA. At phase 12 time, nodes gate set GS and balance BAL return to VHA and ground potential, respectively, to insure turning off devices T9, T10 and T11. During the same initial precharge time period, the restore pulse R is applied to the gates of T22 and T24 to precharge node N3 and the output of the NOR circuit, respectively. After phase 12 time, the memory chip may be in a non-access state for a period of time determined by the regeneration rate necessary to insure the data is not lost in the memory. In response to a chip select signal, a new series of clock signals and control signals are generated which initiates a memory cycle.

Prior to describing detailed read and write operations, it will be helpful to first consider the various effects produced by the different capacitive coupling means associated with the bit lines. Assume first that the difference in charge capable of being stored by storage capacitor CS between high and low state is equal to the charge Q. The dummy capacitances CD associated with the left and right select lines have a charge capacity of Q/2. Similarly the write bias capacitors, which are coupled to both bit lines for withdrawing a common mode charge, have, for example, a charge capacity of Q/2. As previously indicated, the bit driver coupling capacitance CBD is required to offset the negative transitions of the potential on the right bit line RB/L and therefore must have at least a capacitance equal to that of storage capacitor CS and write bias capacitance CWB or 1.5Q as a minimum. The charge coupling effect of bit driver capacitance CBD is required only during a write cycle and has little affect during a read or sense cycle.

Assuming that it is desired to initiate a read cycle, an externally supplied chip select pulse would be applied to the semiconductor chip containing the memory circuit which would initiate the various clocks and timing phases necessary for operation of the overall chip. External storage address signals would be applied to the chip at a time, for example, phase 0, and made available to the word and bit decoders as SAR's between phase 3 and phase 5 time. The absence of any address signal on the lines BSAR's of the bit decoder will enable the previously restored output node of the NOR circuit in the bit decoder to remain charged. At phase 4, drain high restore DHR returns to ground potential, turning off T3 and T4 which have remained conductive throughout the standby state of the memory cycle. Now the sense circuit is ready for its sensing operation with the nodes N1 and N2 charged to VH and left floating. The two bit lines are held at LVHA by T7 and T8 which are just at the point of conduction since their gates are charged to VHA and their drains to VH, which is equal to or higher than VHA. The sense operation consists of regeneratively amplifying an initial potential difference between the two bit/sense lines such that the lower potential is reduced to zero while the higher potential is left at LVHA. During a sense operation, each bit line, whether accessed for reading or not, operates in a similar manner. Only those bit lines corresponding to input addresses applied to the chip are utilized to provide output signals, however. The remaining bit lines are sensed and rewritten, effectively refreshing data stored on their associated bit/sense lines when their transmission gating device T21 is not activated through the bit decoder. As previously described, at phase 4 time the sense amplifier is prepared for the sensing operation. At phase 5 time, the write bias line WB, the decoded half select line RHS or LHS, and one word line W/L are activated. Consider a read operation in which a low charge state is to be read from the right half of the memory array from storage capacitance CS. In this case the left bit line loses charge Q (Q/2 from WB and Q/2 from LHS) and the right bit line loses charge 1.5Q (Q from the memory cell and Q/22 from WB). These losses of charge tend to reduce the bit line potentials, but as T7 and T8 are still biased for conduction they begin to conduct and the charges in fact are drawn from the two sense nodes N1 and N2 as the bit line potentials are attempted to be restored to LVHA. Assuming that the charge extracted from the left bit line has been fully replaced by charge from the sense node N1, the potential on N1 will drop by a factor determined by the ratio of the cell capacitance over the total capacitance of node N1, but will still be higher than the potential on the bit line. On the right side of the array, where 1.5Q has been lost from the bit line, the voltage on node N2 will also drop but to a greater extent than that on node N1. This initial differential is sufficient to start setting the cross-coupled latch comprising devices T1 and T2. At phase 6 time, the drain boost signal DB is switched from zero to VH causing the potentials on both nodes N1 and N2 to be increased insuring that the initially lower potential bit line will be fully recharged. As the potential on node N2 starts to rise T7 may still be conductive attempting to replace the lost charge on the right bit line, but by the time that the full increase in potential is supplied through DB, both T7 and T8 will again be cut off and the full charge transfer amplification differential achieved through the differences in potential in the bit lines, will be seen on nodes N1 and N2. At phase 7 time, the latch node LCHN begins to be pulled slowly towards ground, thus causing the cross-coupled device with its gate coupled to the sense node with the higher potential, in this case N1 and T2, to turn on and start setting the latch. At phase 8 time, latch node LCHN is fully discharged to ground which causes the charge of sense node N2 to be fully discharged causing device T7 to turn on and causing the right bit line, in turn, to be fully discharged to ground. At the same time sense node N1 is held at its previous potential and the left bit line is still retained at its precharge potential of LVHA. If the particular bit line was required to be sensed through gating of the transmission gate device T21 the decoded read/write pulse R+W' would have risen from ground to VH on a read cycle at phase 7 time causing T21 to be conditioned for conduction. The effect of the coupling of the rising read/write pulse through bit drive capacitor CBD has no effect on the setting of the sense latch as the latch begins to be set at phase 7 time which is after the bit lines have been restored beginning at phase 6 time and since the device T7 acts as a reverse biased diode. If the right bit line RB/L is sensed to be in the high state, the initially precharged input/output node N3 will remain charged or in a similar manner will be discharged when the right bit line gets pulled to ground through devices T7 and T2. The potential on node N3 is then passed through a clocked inverter circuit 52 and applied to the data pad 50 for external use. If a high charge state had been sensed on the right half of the array, the right bit line would have lost only 0.5Q and the potential of sense node N2 would have ended at a higher potential than that of N1 because the left bit line would have lost the charge Q.

During a write operation it is necessary to provide an overriding input signal from the right bit line to the sense amplifier so that at phase 7 time when the sense latch is set it will establish the proper potential on the bit lines to store the desired data. If a logical signal corresponding to a high level input signal is applied to data pad 50 during the initial few phases of the memory cycle, data T/C generator 48 will provide a write WRITE' signal to the gate of device T23 beginning at phase 4 time discharging node N3. If a node level logic condition is to be stored, the WRITE' signal does not appear and the data I/O node N3 is not discharged. Another difference between a read and write operation is that on a write cycle the R+W pulse is advanced to appear at phase 4 time. Since the word line W/L and the other capacitive coupling means associated with the bit lines are not activated until phase 5 time, at phase 4 during a write cycle when R+W' line goes from ground to VH and if a high level logic state is not being written (node N3 remains charged), right bit line RB/L receives an increase in potential caused by the addition of 1.5Q through capacitor CBD. At phase 5 time, when one of the word lines WL to the right or left half of an array is selected, a charge of 1.5Q (no charge stored on CS and right bit line selected), 0.5Q (Q stored on CS and right word line selected), or Q (left word line selected) will be removed from the right bit line. The left bit line, having no added charge will have only charge removed and its potential will decrease as a result of having 0.5Q, Q or 1.5Q removed from it. Since the resulting potential on the right bit line will either remain at its precharge level or will be increased, no charge is transferred from sense node N2 through T7 to the right bit line. As a result, only sense node N1 will supply charge to the left bit line causing its potential to be decreased and allowing the latch to be set with the left bit line being discharged and the right bit line being retained at a high potential.

In the write operation, when node N3 is discharged, indicating that a low charge level is to be stored on the right bit line or a high charge level is to be stored on the left bit line, both the right bit line and sense node N2 will be discharged to ground through device T7, T21 and T23. Device T23 is preferably large enough so that it discharges these nodes including any increase provided by bit driver capacitor CBD. As in the read operation, the latch is set when latch node LCHN is discharged to ground.

The amplification process is complete by phase 9 when one of the bit lines will be at zero potential and the other still at its precharge potential of LVHA. At phase 9 the potential of the selected word line returns to zero and the selected cell capacitor CS is disconnected from the bit line being either charged or discharged depending upon the potential of the bit line. At this point, the write and refresh process of the cell is complete and restoration of the sense circuit for the next cycle can begin as previously described.

Those skilled in the art will recognize that the decode circuit including the bit drive capacitor CBD and gating device T21 may be utilized in a directly driven dynamic cross-coupled latch, such as described in FIG. 1, in which the bit lines are unconditionally restored to VH or the highest potential available on the chip. Since the actuation of the bit decoder in a select condition causes the addition of charge to the right bit line, this charge causes the potential of the right bit line to rise higher than VH such that the dynamic latch may be set with the right bit line high without the necessity of directly accessing and discharging the left bit line.

The FET devices and capacitances utilized in the above described circuit may be fabricated in accordance with the process described in U.S. Pat. No. 3,811,076, entitled "Field Effect Transistor Integrated Circuit and Memory," issued May 14, 1974, to W. M. Smith, Jr., and assigned to the assignee of the instant invention. Those skilled in the art will also recognize the various other minor modifications may be made to the circuitry described, such as, utilizing VH potential on the gate of charge transfer devices T7 and T8 in which case the bit lines would be charged to one threshold below Vh or LVH. If the difference in potential between the sense nodes N1 and N2 and the bit lines is sufficiently high, the application of drain boost may be reduced or eliminated. The application and timing of the various control signals may also be altered.

Although the invention has been particularly shown and described with reference to a preferred embodiment thereof, it will be understood by those skilled in the art that the foregoing and other changes in form and details may be made therein without departing from the spirit and scope of the invention.

What is claimed is:

1. In a memory system including a plurality of charge storage cells associated with first and second bit/sense lines coupled to a differential sense amplifier circuit, the improvement comprising:

power supply potential means, said means being the highest potential available to said amplifier circuit;

means to precharge sid bit/sense lines to a potential substantially equal to said power supply potential; and write means coupled to said first bit/sense line, said write means including capacitive coupling means responsive to the joint presence of an information signal, representative of a first logic state, and to a decoded bit address signal to provide an increase in potential of said first bit/sense line to cause said sense amplifier to provide a signal representative of a second logical state to be sensed and stored in an addressed charge storage cell coupled to said second bit/sense line.

2. The memory system of claim 1 wherein said sense amplifier comprises cross-coupled field effect transistor devices.

3. The memory system of claim 1 wherein said bit/sense lines are precharged to a potential one threshold drop less than said supply potential.

4. The memory system of claim 1 wherein said charge storage cells consists of a field effect gating device and a storage capacitance.

5. The memory system of claim 1 wherein said write means comprises a field effect transistor having one of its current conducting electrodes connected to said first bit/sense line, the other current conducting electrode responsive to said information signal and its control electrode responsive to said decoded bit address signal.

6. The memory system of claim 5 wherein said field effect transistor has a coupling capacitance between its gate electrode and said first bit/sense line, and further wherein charge stored on said coupling capacitance is transferred to said first bit/sense line in response to the application of said decoded bit address signal in the presence of said information signal.

7. The memory system of claim 6 wherein said field effect transistor is utilized as a transmission gate to transfer information, sensed by said sense amplifier, to an output means.

8. In the memory system including first and second groups of charge storage means, each group being associated, respectively, with first and second bit/sense lines, the improvement comprising:

an information signal source;

a differential sense amplifier coupled to said bit/sense lines, said sense amplifier including a pair of charge transfer amplifying input means;

decoding means for coupling a decoded information signal corresponding to a first logical state to said first bit/sense line during at least a portion of a write cycle; and write bias means coupled to said second bit/sense line for unconditionally causing at least the one of said charge transfer amplifying input means coupled to said second bit/sense line to become conductive during said portion of the write cycle to cause an information signal of a second logical state to be stored in one of said charge storage means associated with said second bit/sense line in response to said decoded information signal.

9. The memory system of claim 8 wherein said write bias means comprises a capacitance coupled to said second bit/sense line.

10. The memory system of claim 9 wherein said write bias means withdraws charge from said second bit/sense line causing the potential of said second bit/sense line to decrease.

11. The memory system of claim 10 wherein there is provided a second write bias means coupled to said first bit/sense line to provide a common mode write bias signal to said bit/sense lines during said portion of a write cycle, and wherein there is further provided a charge coupling means coupled to said first bit/sense line for coupling a charge into said first bit/sense line during said portion of a write cycle, said charge being at least equal in magnitude to any charge withdrawn from said first bit/sense line.

12. The memory system of claim 11 wherein said charge coupling means is responsive to said decoding means.

13. The memory system of claim 12 wherein said decoding means comprises a common input/output information gating means, said gating means responsive to a bit/sense line addressing signal and an information signal.

14. The memory system of claim 13 wherein said common input/output information gating means comprises a field effect transistor and said charge coupling means comprises a capacitance between the gate electrode of said transistor and one of the current conducting electrodes of said transistor.

15. In a semiconductor memory array circuit including a plurality of charge storage means associated with a pair of bit/sense lines coupled to a differential sense amplifier, the improvement comprising capacitative coupling means connected to each one of said pair of bit/sense lines for simultaneously with drawing a common mode charge from each of said bit/sense lines.

16. The memory system of claim 15 wherein said common mode charge equals one-half the maximum charge quantity capable of being stored by one of said charge storage means.

17. A semiconductor circuit comprising; first, second, third and fourth voltage nodes;

a field effect transistor having a gate electrode coupled to said first voltage node, and first and second current conducting electrodes respectively coupled to said second and third voltage nodes;

capacitative coupling means having a first and second electrode, said first electrode coupled to said second voltage node and said second electrode coupled to said fourth voltage node;

means for precharging said second and third voltage nodes to predetermined potentials;

means for charging said capacitative coupling means;

and means responsive to an input signal for increasing the potential of said first voltage node to a potential less than either of said predetermined potentials and for increasing the potential of said fourth voltage node to cause charge to be coupled to said second voltage node.

18. The semiconductor circuit of claim 17 wherein there is further provided circuit means responsive to a second input signal for selectively discharging said third voltage node.

19. The semiconductor circuit of claim 18 wherein said first and second input signals occur simultaneously.

20. The semiconductor circuit of claim 17 wherein said first and fourth voltage nodes are connected together.

* * * * *